US005975236A

United States Patent [19]

Yamamoto et al.

[11] Patent Number: 5,975,236

[45] Date of Patent: Nov. 2, 1999

[54] SPEAKER ASSEMBLY

[76] Inventors: Shuji Yamamoto, 938 Salem End Rd., Framingham, Mass. 01702; Richard G. Plourde, 17D Hampshire Dr., Nashua, N.H. 03063-1930

[21] Appl. No.: 09/004,493

[22] Filed: Jan. 8, 1998

[51] Int. Cl.$^{6}$ ........................................ H05K 5/00

[52] U.S. Cl. ........................................ 181/156; 181/152

[58] Field of Search ........................................ 181/152, 156, 181/154, 144, 141, 199

[56] References Cited

U.S. PATENT DOCUMENTS

| | | | |
|---|---|---|---|
| 4,437,540 | 3/1984 | Murakami et al. | 181/152 |
| 4,733,749 | 3/1988 | Newman et al. | 181/152 |
| 4,923,031 | 5/1990 | Carlson | 181/156 |
| 5,109,422 | 4/1992 | Furukawa . | |
| 5,278,361 | 1/1994 | Field | 181/156 |
| 5,526,456 | 6/1996 | Heinz | 181/152 |
| 5,606,626 | 2/1997 | Kim et al. . | |

*Primary Examiner*—Khanh Dang
*Attorney, Agent, or Firm*—Milton E. Gilbert

[57] ABSTRACT

A speaker assembly comprising an elongated unitary member having a first end and a second end. The elongated member is formed into a generally box-shaped configuration having an open top, an open bottom and an internal box cavity. The first and second ends of the elongated member are separately positioned within the internal box cavity to form first and second internal sidewalls, respectively. First and second internal sidewalls define a sound path therebetween which is in communication with the internal box volume and an external portion of the elongated member. A first speaker is disposed in the first internal sidewall and a second speaker is disposed in the second internal sidewall, with first and second speakers facing directly into the sound path. A top panel is mounted on the elongated member over the open top and a bottom panel is mounted on the elongated member under the open bottom. In use, first and second speakers produce directly radiated and resonantly radiated sound waves which propagate out from the speaker assembly through the sound path.

20 Claims, 4 Drawing Sheets

SPEAKER ASSEMBLY

BACKGROUND OF THE INVENTION

The present invention relates generally to speakers and, more particularly, is directed to ported speakers.

Speakers, or loudspeakers, are well known and are commonly used in a wide variety of applications, such as in home theater stereo systems.

Speakers typically comprise a hollowed out cabinet, or box, which is commonly manufactured of plywood, particle board or medium-density fiberboard. Various electrical components, such as a crossover, an L-pad and a terminal cup, are disposed within the cabinet and are electrically connected to an amplifier for the stereo system. One or more speaker units, such as tweeters and woofers, are positioned and sealed within associated holes formed into the surface of the cabinet. The speaker units are electrically connected to the electrical components of the speaker and vibrate in response to electrical inputs to produce sound.

Speaker cabinets are often manufactured using the following technique. An elongated strip of vinyl-laminated particle board having a first end and a second end is cut at predetermined locations. The elongated strip is then folded at the cut portions and the first and second ends are sealed together to form a four-sided, box-shaped configuration having an open top, an open bottom and an internal box cavity. A rectangular top panel and a rectangular bottom panel are permanently mounted on opposite sides of the elongated strip to enclose the internal box cavity.

One drawback of speaker cabinets manufactured in the manner noted above is that the final closure point of the first end of the elongated strip to the second end has often been found to be inadequately sealed. As a result, regions of the cabinet may vibrate which, in turn, produces noise, which is undesirable. In order to eliminate the vibratory noise, the inadequately sealed portion of the cabinet must be resealed air tight. This resealing process is typically a time-consuming and costly procedure.

In the art of speaker design, engineers are constantly striving to maximize speaker acoustical performance while, at the same time, minimize overall speaker size. In particular, it is a common object in the art to improve the range and quality of low frequency, or bass, sounds without greatly increasing the overall size of the speaker.

In order to produce stronger and deeper bass frequencies without increasing overall speaker size, it is well known in the art to provide a port in the cabinet of the speaker. A port is generally an open duct which includes a sound path that communicates the internal box volume of the cabinet with an external portion of the cabinet. Ported speakers, also commonly referred to as bass-reflex, vented, or phase-inverted speakers, have a resonant frequency which is defined by the air spring of the internal box volume of the cabinet and the air mass in the sound path of the port. At frequencies higher than the resonant frequency, the sound passing through the sound path is inverted and the sound emitted from the driver is in-phase. The two sounds are in-phase added to one another to increase sound pressure. As a result of the in-phase addition, the low frequency characteristics of the output sound pressure are expanded.

The frequency characteristics of ported speakers are directly attributable to the cross-sectional area of the sound path of the port, the length of the neck of the port and the internal box volume of the cabinet. By balancing the dimensions of the port and cabinet of the speaker, the acoustical performance of the speaker can be maximized without significantly increasing the overall size of the speaker, which is desirable.

Although ported speakers are well-known and commonly used in the art, they nonetheless experience noticeable drawbacks.

As a first drawback, the implementation of a port into the cabinet of a speaker requires additional steps in manufacturing, which thereby increases the total cost of the speaker.

As a second drawback, it has been found that an open duct resonance, wind noise, turbulence, or the like often occurs at the port. Specifically, a port of considerably narrow cross-section causes air which passes therethrough to move at a high speed. The high speed of the air passing through the port, in turn, collides against the edge portion of the port at the portion where the air flow passing through the port cannot become uniform, e.g., the small diameter portion or openings at two ends of the open duct port, thus causing wind noise or turbulence.

In U.S. Pat. No. 5,109,422 to K. Furukawa, there is disclosed an acoustic apparatus comprising a Helmholtz resonator which has a cavity and an open duct port for causing the cavity to communicate with an external region thereof and a vibrator which is arranged in the resonator to drive the resonator. In a first aspect, the open duct port comprises an air permeable member having a proper acoustic and resistance and a viscoelastic member having no air permeability so that noise caused by an open duct resonance, wind noise, turbulence or the like is prevented. In a second aspect, a viscoelastic member is disposed at the mounting portion between the open duct port and a cabinet defining the cavity so that transmission to the cabinet of derivative vibration caused at the open duct port is prevented. In a third aspect, the portion, opposite to the open duct port, of an ornament grille attached to the front surface of the acoustic apparatus is given a larger air permeability than other portions of the grille so that wind noise when the grille is attached before the open duct port is prevented. Thus, noise generated when the resonator is driven is prevented or eliminated and distortion characteristics of the apparatus are improved.

In U.S. Pat. No. 5,606,626 to C. H. Kim et al, there is disclosed a speaker system with an anion generator and a television set using the speaker system. The speaker system includes an anion generator provided within a speaker box. Sound pressure is used to help spread the generated anions outside the speaker box. An antistatic agent may optionally be provided on one or more surfaces of the speaker box to prevent static charge build-up within the speaker box.

SUMMARY OF THE INVENTION

It is an object of this invention to provide a new and improved speaker assembly.

It is another object of this invention to provide a speaker assembly which produces a broad range of high quality sounds and in particular, low frequency sounds.

It is yet another object of this invention to provide a speaker assembly which is relatively simple and inexpensive to manufacture.

It is still another object of this invention to provide a speaker assembly which is relatively rigid.

It is another object of this invention to provide a speaker assembly which is relatively small in size.

It is yet another object of the present invention to provide a speaker assembly which has a limited number of parts and which is easy to use.

Accordingly, there is provided a speaker assembly, comprising an elongated member having a first end and a second end, said elongated member being formed into a generally box-shaped configuration having an open top, an open bottom and an internal box cavity, the first end and the second end being positioned within the internal box cavity separate from one another, a first speaker disposed in said elongated member, said first speaker comprising a front surface side and a rear surface side, a first panel mounted on said elongated member over the open top, and a second panel mounted on said elongated member under the open bottom.

Various other features and advantages will appear from the description to follow. In the description, reference is made to the accompanying drawings which form a part thereof, and in which is shown by way of illustration, specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

A fuller understanding of the nature and objects of the present invention will become apparent upon consideration of the following detailed description taken in connection with the accompanying drawings, wherein like reference numerals represent like parts.

DETAILED DESCRIPTION OF THE PREFERRED EMBODIMENT

Figure 1:
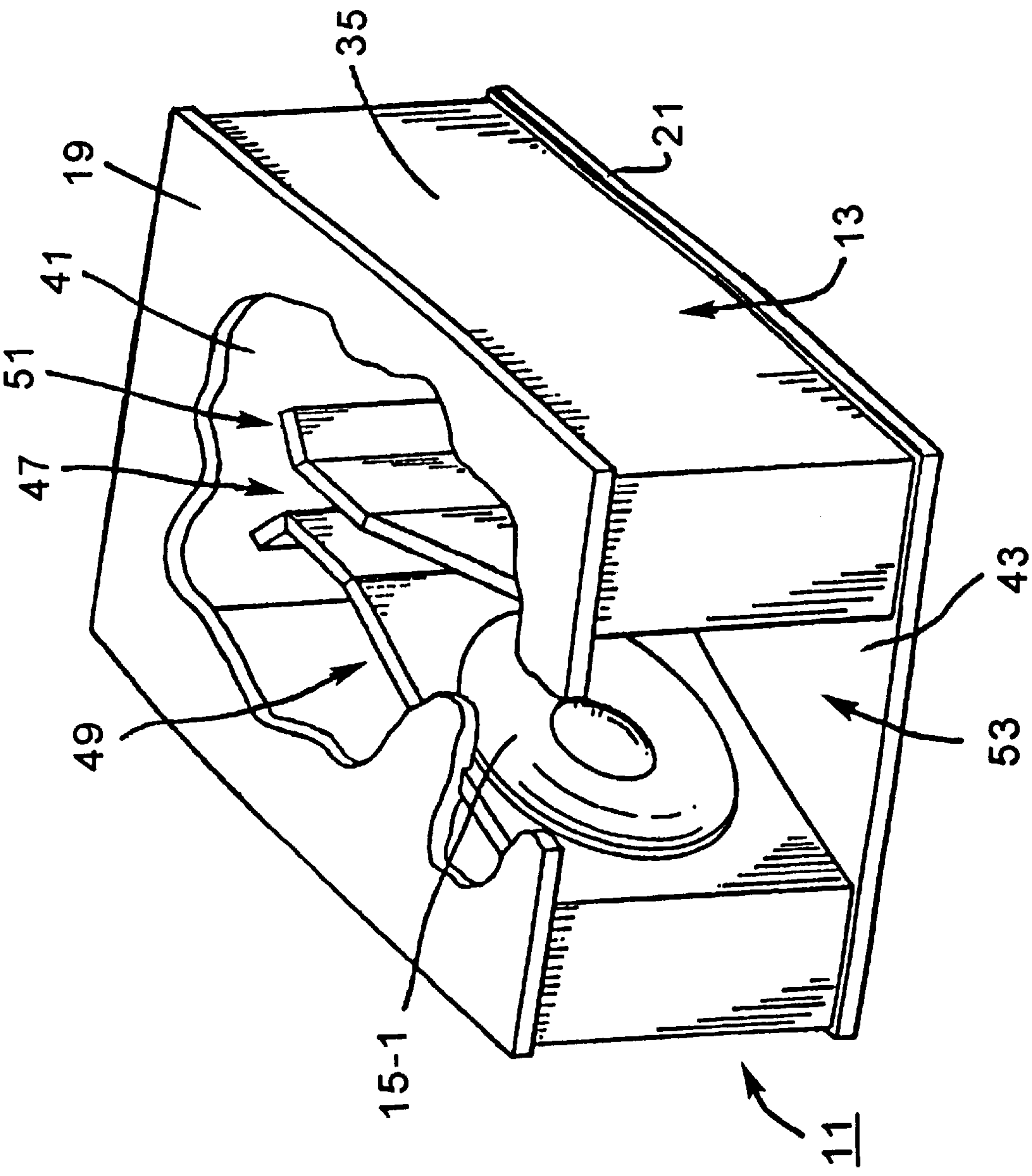
FIG. 1 is a perspective view of a first embodiment of a speaker assembly constructed according to the teachings of the present invention, the top panel being shown partially broken away.
Figure 3:
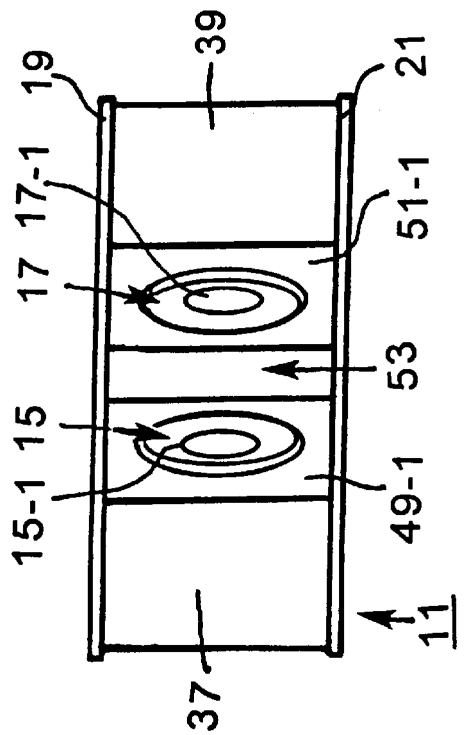
FIG. 3 is a front plan view of the speaker assembly shown in FIG. 1.
Figure 2:
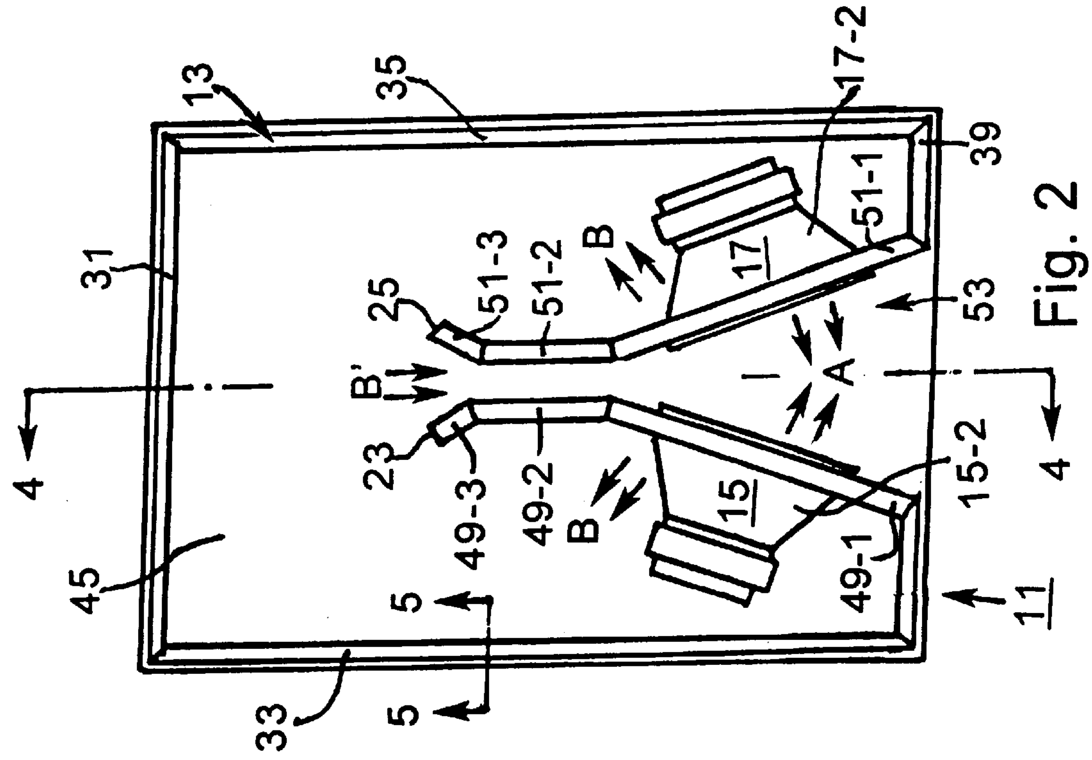
FIG. 2 is a top plan view of the speaker assembly shown in FIG. 1, the speaker assembly being shown with the top panel removed.

Referring to FIGS. 1—5, there is shown a first embodiment of a speaker assembly constructed according to the teachings of the present invention, the speaker assembly being identified generally by reference numeral 11.

Speaker assembly 11 comprises a strip of material 13, a first speaker 15 disposed in strip of material 13, a second speaker 17 disposed in strip of material 13, a top panel 19 and a bottom panel 21.

Strip of material 13 is an elongated, unitary member constructed of a rigid material, such as a particleboard P (see FIG. 5) laminated with a thin layer of vinyl V, and includes a first end 23, a second end 25, a top surface 27 and a bottom surface 29. Strip of material 13 is formed into a generally box-shaped configuration which includes a rear wall 31, a pair of outer sidewalls 33 and 35 and a pair of front walls 37 and 39 which together generally define an open top 41, an open bottom 43 and an internal box cavity 45.

Strip of material 13 is also shaped so that first end 23 and second end 25 are positioned within inner box cavity 45 at locations separate from one another. Positioned as such, strip of material 13 forms an open duct port 47 for enhancing the bass response of speaker assembly 11.

Port 47 is shaped to include a first inwardly projecting internal sidewall 49, a second inwardly projecting internal sidewall 51 and a sound path 53 defined by first inner sidewall 49 and second inner sidewall 51, sound path 53 being in communication with both inner box cavity 45 and an external portion of strip of material 13. First inner sidewall 49 includes a front section 49-1 contiguous with front wall 37, an intermediate section 49-2 contiguous with front section 49-1 and a rear section 49-3 contiguous with intermediate section 49-2, the free end of rear section 49-3 being first end 23. Second inner sidewall 51 includes a front section 51-1 contiguous with front wall 39, an intermediate section 51-2 contiguous with front section 51-1 and a rear section 51-3 contiguous with intermediate section 51-2, the free end of rear section 51-3 being second end 25.

It should be noted that the positioning of first end 23 and second end 25 separately within inner box cavity 45 not only serves to create a port for enhancing the acoustical performance of speaker assembly 11, but it also serves to create numerous advantages in construction. For instance, the positioning of first end 23 and second end 25 separately within inner box cavity 45 serves to strengthen the overall structure of speaker assembly 11, which is highly desirable. In addition, the positioning of first end 23 separate from second end 25 serves to eliminate the need to create an air tight final closure seal between first and second ends 23 and 25. As can be appreciated, this greatly simplifies the entire construction process for speaker assembly 11 (particularly because strip of material 13 is a unitary member) and, at the same time, serves to eliminate a source for vibratory noise in speaker assembly 11, which is desirable.

Strip of material 13 can be formed into its box-shaped configuration using well-known techniques. For example, strip of material 13 can be constructed as a straight piece of material which is then cut and bent at predetermined locations to form the desired shape. As another example, strip of material 13 could be manufactured using well-known molding techniques.

Strip of material 13 also comprises a pair of openings (not shown) into which first and second speakers 15 and 17 are disposed, respectively. First and second speakers 15 and 17 represent any type of speaker unit which is well known in the art, such as a woofer or a tweeter, and function to convert the electrical energy it receives from the speaker electronics (not shown) into acoustic energy, i.e. sound waves. It is desirable that speakers 15 and 17 be disposed within its associated opening so as to create a tight seal against strip of material 13. It should be noted that although speaker assembly 11 is shown with two speakers, it is to be understood that additional speakers could be disposed into strip of material 13 without departing from the spirit of the present invention.

First speaker 15 comprises a front surface side 15-1 and a rear surface side 15-2 and is disposed in front section 49-1 of inner sidewall 49 so that front surface side 15-1 faces out into sound path 53 and rear surface side 15-2 faces out into inner box cavity 45. Similarly, second speaker 17 comprises a front surface side 17-1 and a rear surface side 17-2 and is disposed in front section 51-1 of inner sidewall 51 so that front surface side 17-1 faces out into sound path 53 and rear surface side 17-2 faces out into inner box cavity 45.

In use, speakers 15 and 17 vibrate in response to the electrical energy it receives from the speaker electronics (not shown) to produce sound waves. Specifically, the vibration of speakers 15 and 17 produces directly radiated sound waves A which propagate out from front surface sides 15-1 and 17-1 of speakers 15 and 17, respectively, and exit speaker assembly 11 through sound path 53. In addition, the vibration of speakers 15 and 17 produces resonantly radiated sound waves B which propagate out from rear surface sides 15-2 and 17-2 of speakers 15 and 17, respectively. A portion B' of resonantly radiated sound waves B is reflected within inner box cavity 45 and exits speaker assembly 11 through sound path 53.

It should be noted that both directly radiated sound waves A and portion B' of resonantly radiated sound waves B pass through the same sound path 53. As can be appreciated, the use of single sound path 53 to propagate directly and resonantly radiated sound waves produces numerous acoustical advantages. For example, because both sound waves mix prior to exiting speaker assembly 11, at low frequencies (in particular, subsonic frequencies), there exists no significant net air motion out of speaker assembly 11. This inherently eliminates turbulence noise created at port 47. As another example, because both sound waves mix prior to exiting speaker assembly 11, air mass becomes trapped within port 47. The trapped air mass operates as a noise filter that attenuates turbulence noise from within inner box cavity 45.

Figure 5:
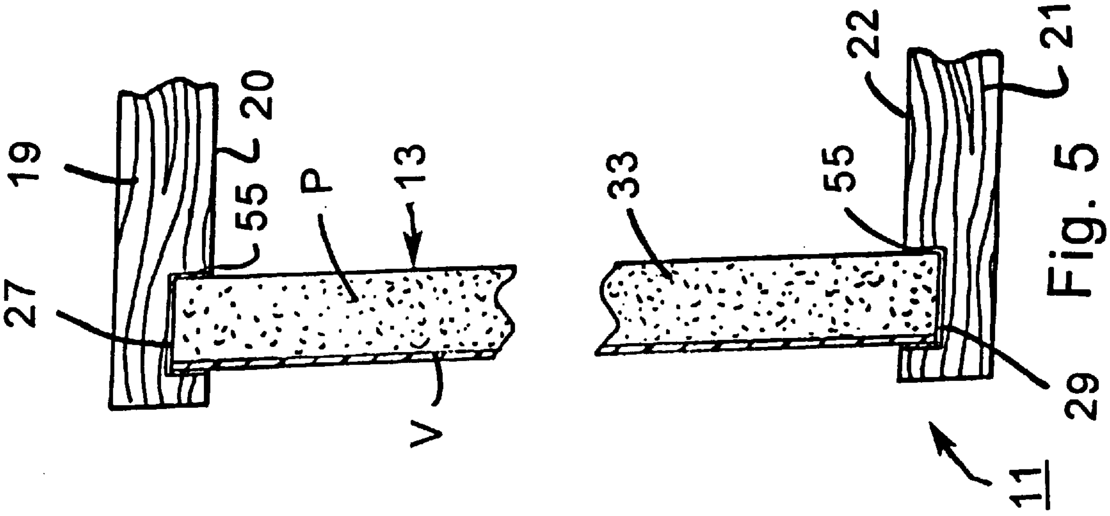
FIG. 5 is a fragmentary, section view, broken away in part, of the speaker assembly shown in FIG. 2, taken along lines 5—5, the speaker assembly being shown with the top panel mounted thereon.
Figure 4:
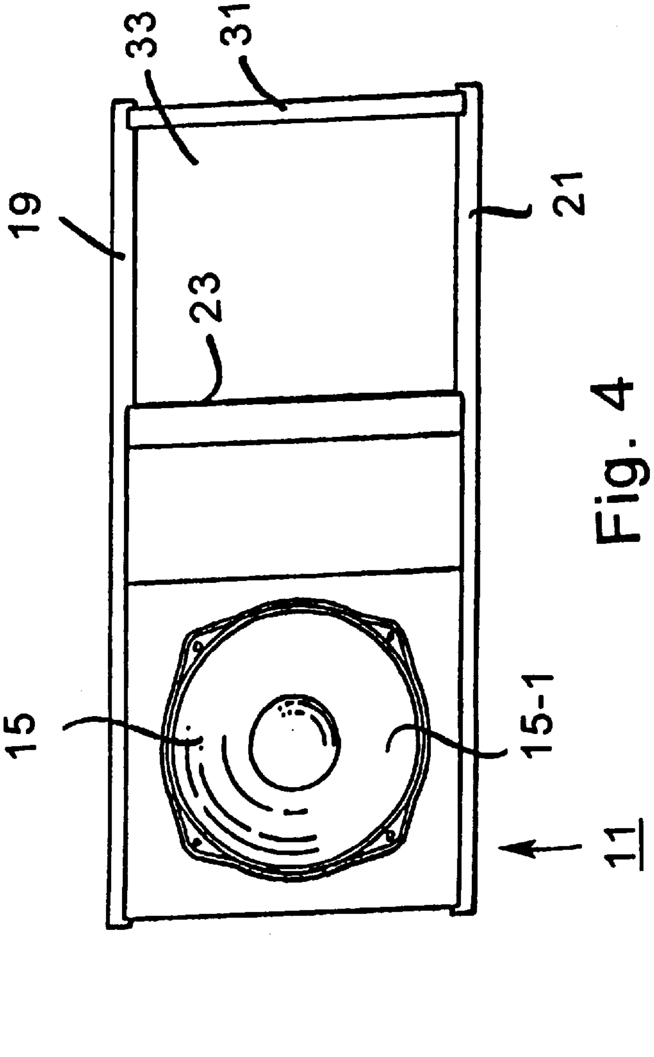
FIG. 4 is a right side view of the speaker assembly shown in FIG. 2, taken along lines 4—4.

Top panel 19 is a generally rectangular member which is mounted on top surface 27 of strip of material 13 and held in place by an adhesive 55 (see FIG. 5). Top panel 19 is constructed of a rigid material, such as wood, and includes a bottom surface 20 which is grooved in the configuration of strip of material 13 so as to enable top panel 19 to be fittingly mounted on strip of material 13, as shown in FIG. 5.

Similarly, bottom panel 21 is a generally rectangular member which is mounted on bottom surface 29 of strip of material 13 and held in place by an adhesive 55. Bottom panel 21 is constructed of a rigid material, such as wood, and includes a top surface 22 which is grooved in the configuration of strip of material 13 so as to enable bottom panel 21 to be fittingly mounted on strip of material 13, as shown in FIG. 5.

It should be noted that the multisided design of port 47 serves to attenuate noise produced by air as it propagates through sound path 53. Specifically, the angling of front sections 49-1 and 51-1 relative to front walls 37 and 39, respectively, the angling of intermediate sections 49-2 and 51-2 relative to front sections 49-1 and 51-1, respectively, and the angling of rear sections 49-3 and 51-3 relative to intermediate sections 49-2 and 51-2, respectively, serve to attenuate noise. In particular, because port 47 is angled and includes variances in cross-sectional area noise will be reflected and, resultingly, attenuated for port 47 acts as a nondissipative muffler.

Figure 6:
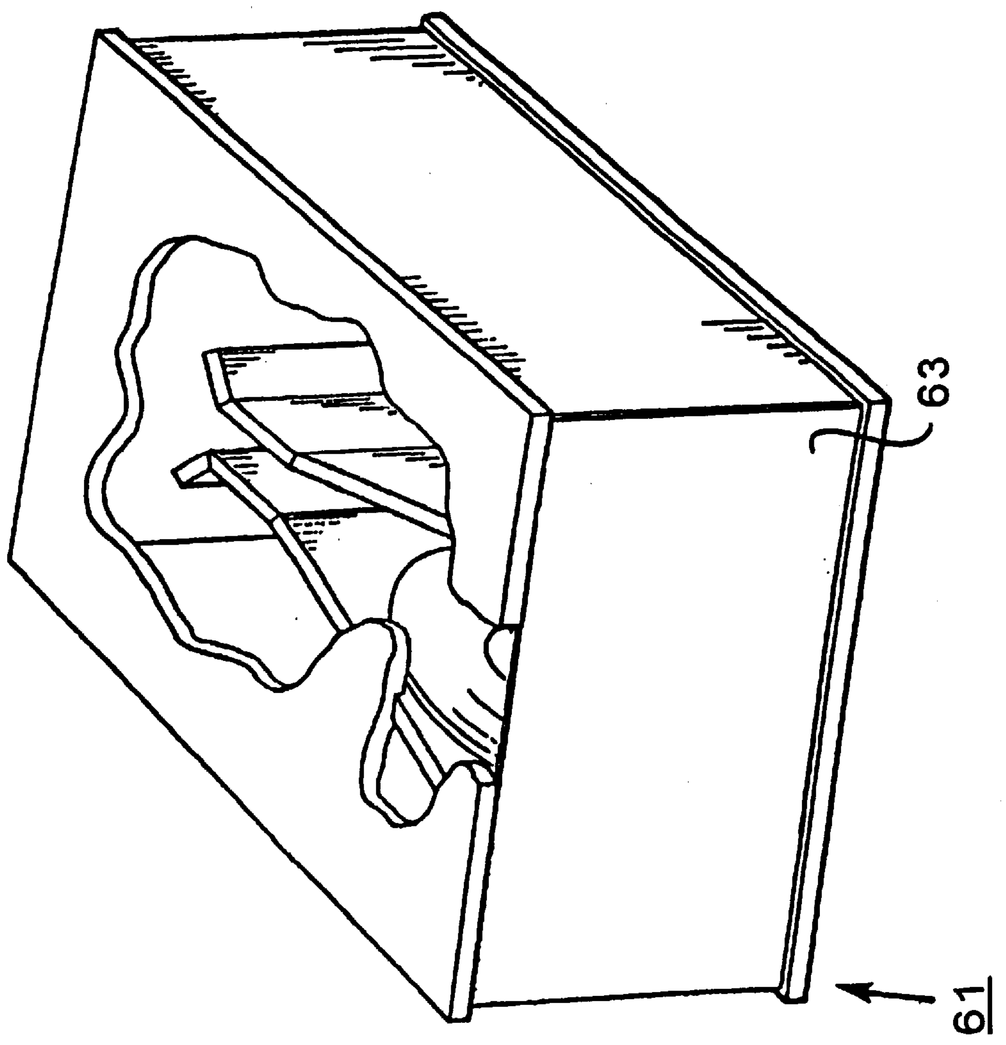
FIG. 6 is a perspective view of a second embodiment of a speaker assembly constructed according to the teachings of the present invention, the top panel being shown partially broken away.

Referring now to FIG. 6, there is shown a second embodiment of a speaker assembly constructed according to the teachings of the present invention, the speaker assembly being identified generally by reference numeral 61.

Speaker assembly 61 differs from speaker assembly 11 only in that it further comprises a cover 63 which is mounted on front walls 37 and 39 to entirely close speaker assembly 11. Cover 63 may be constructed of any suitable material such as a transparent cloth grill cover, a closed membrane or a diaphragm. It should be noted that, because of the elimination of net air motion out of speaker assembly 11 at very low frequencies, cover 63 may be a closed membrane or diaphragm. As can be appreciated, the use of a closed membrane or diaphragm would allow for speaker assembly 11 to be totally enclosed, (and accordingly can be covered by wallpaper or paint) to reduce the obtrusiveness of speaker assembly 11 in use.

The embodiments shown in the present invention are intended to be merely exemplary and those skilled in the art shall be able to make numerous variations and modifications to it without departing from the spirit of the present invention. For example, it should be noted that strip of material 13 could be manufactured out a plurality of pieces instead of a unitary piece. All such variations and modifications are intended to be within the scope of the present invention as defined in the appended claims.

What is claimed is:

1. A speaker assembly, comprising;

(a) an elongated integral member having a first end and a second end, said elongated member being formed into a generally box-shaped configuration having an open top, an open bottom, and an internal box cavity, the first end and the second end being positioned within the internal box cavity seperated from one another, the first end of said elongated member projecting into the internal cavity so as to form a first internal sidewall comprising a front section, an intermediate section and a rear section, and the second end of said elongated member projecting into the internal box cavity to form a second internal sidewall, said first and second sidewalis defining a sound path therebetween which is in communication with the internal box volume and an external portion of said elongated member, (b) a speaker disposed in the front section of said first internal sidewall, said speaker comprising a front surface side and a rear surface side, the front surface side of said speaker facing the sound path, (c) a first panel mounted on said elongated member over the open top, (d) a second panel mounted on said elongated member under the open bottom, and (e) wherein said speaker produces directly radiated and resonantly radiated sound waves which propagate out from said speaker assembly into and through the sound path, without physical interference.

2. The speaker assembly as claimed in claim 1 further comprising a covrer externally mounted on said elongated member over the sound path.

3. The speaker assembly as claimed in claim 2 wherein said cover is a closed membrane.

4. The speaker assembly as claimed in claim 2 wherein said cover is a diaphragm.

5. The speaker assembly as claimed in claim 1 wherein said second internal sidewall comprises a front section, an intermediate section and a rear section, and further comprising a second speaker having a front surface side and a rear surface side and mounted in the front section of the second internal sidewall, with the front surface side of said second speaker facing the sound path, wherein said first and second speakers produce directly radiated sound waves which propagate out from said speaker assembly into and through the sound path without physical interfernce.

6. The speaker assembly as claimed in claim 5 further comprising a cover externally mounted on said elongated member over the sound path.

7. The speaker assembly as claimed in claim 6 wherein said cover is a closed membrane.

8. The speaker assembly as claimed in claim 6 wherein said cover is a diaphragm.

9. A speaker assembly, comprising in combination:

an elongated integral member having a first end and a second end, said elongated member being formed into a generally box-shape configuration having an open top, an open bottom, a front wall having an opening therein, and an internal box cavity;

said first and the second end projecting into the internal box cavity to form first and second internal sidewalls, said sidewalls being positioned within the internal box cavity spaced apart from one another throughout their extent, and communicating with the opening in the front wall so as to form an uninterrupted sound path leading from the internal box cavity externally of the cabinet;

a speaker having a front surface side and a rear surface side, said speaker having its front surface side mounted in one of said sidewall adjacent said front wall opening in said sidewall and in direct communication with said sound path;

whereby said speaker produces directly radiated and resonantly radiated sound waves which propagate out from said speaker assembly through the sound path.

10. The speaker assembly of claim 9 wherein said sidewall are each formed with a front section, an intermediate section and a rear section, the speaker having its front surface side mounted in the front section of one of the sidewalls.

11. The speaker assembly of claim 10 wherein the intermediate sections of said first and second sidewalls are parallel to one another.

12. The speaker assembly as claimed in claim 9 further comprising a cover externally mounted on said elongated member over the sound path.

13. The speaker assembly as claimed in claim 12 wherein said cover is a closed membrane.

14. The speaker assembly as claimed in claim 12 wherein said cover is a diaphragm.

15. The speaker assembly of claim 9 including a second speaker having a front surface side and a rear surface side, said second speaker having its from surface side mounted in the other one of said sidewalls adjacent said front wall opening in said sidewall and in direct communication with said sound path;

whereby both of said first and second speakers produce directly radiated and resonantly radiated sound waves which progagate out from said speaker assembly through the sound path.

16. The speaker assembly of claim 15 wherein said sidewalls are each formed with a front section, an intermediate section and a rear section, the first speaker having its front surface side mounted in the front section of one of the sidewalls, and the second speaker having its front surface side mounted in the front section of the other of said sidewalls.

17. The speaker assembly of claim 16 wherein the intermediate sections of said first and second sidewalls are parallel to one another.

18. The speaker assembly as claimed in claim 15 further comprising a cover externally mounted on said elongated member over the sound path.

19. The speaker assembly as claimed in claim 18 wherein said cover is a closed membrane.

20. The speaker assembly as claimed in claim 18 wherein said cover is a diaphragm.

* * * * *